United States Patent [19]

Anthony et al.

[11] 3,982,268

[45] Sept. 21, 1976

[54] DEEP DIODE LEAD THROUGHS

[75] Inventors: Thomas R. Anthony; Harvey E. Cline, both of Schenectady, N.Y.

[73] Assignee: General Electric Company, Schenectady, N.Y.

[22] Filed: Mar. 14, 1975

[21] Appl. No.: 558,221

Related U.S. Application Data

[63] Continuation of Ser. No. 411,295, Oct. 30, 1973, abandoned.

[52] U.S. Cl. .................... 357/55; 357/48; 357/60; 357/68; 357/89; 357/90; 148/1.5
[51] Int. Cl.² .............. H01L 29/06; H01L 27/04; H01L 29/04; H01L 23/48
[58] Field of Search ............ 357/60, 48, 55, 68, 357/89, 90

[56] References Cited
UNITED STATES PATENTS

| | | | |
|---|---|---|---|
| 2,813,048 | 11/1957 | Pfann | 357/60 |
| 3,648,131 | 3/1972 | Stuby | 357/60 |
| 3,656,028 | 4/1972 | Langdon | 357/60 |

*Primary Examiner*—Edward J. Wojciechowicz
*Attorney, Agent, or Firm*—Donald M. Winegar; Joseph T. Cohen; Jerome C. Squillaro

[57] ABSTRACT

A body of semiconductor material has two major opposed surfaces. A region of recrystallized semiconductor material having solid solubility of a dopant material therein is disposed within, and extends entirely through the body and intersects the two major opposed surfaces. The recrystallized region of material is employed as an electrical means to interconnect electrical elements associated with the respective opposed major surfaces.

29 Claims, 4 Drawing Figures

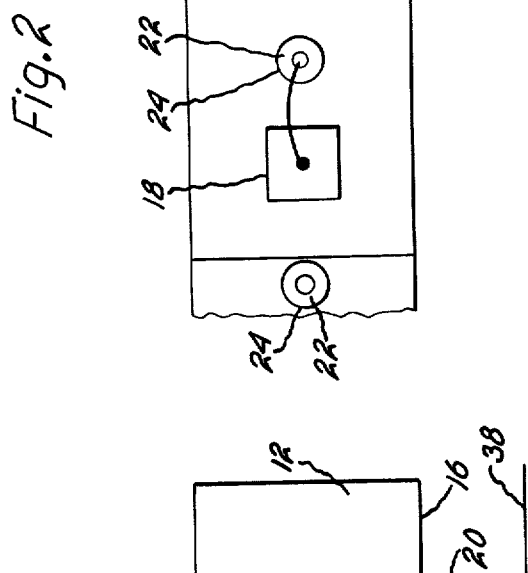
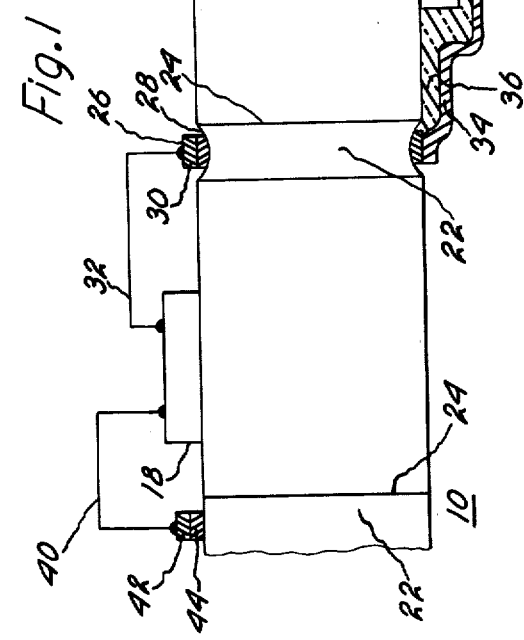
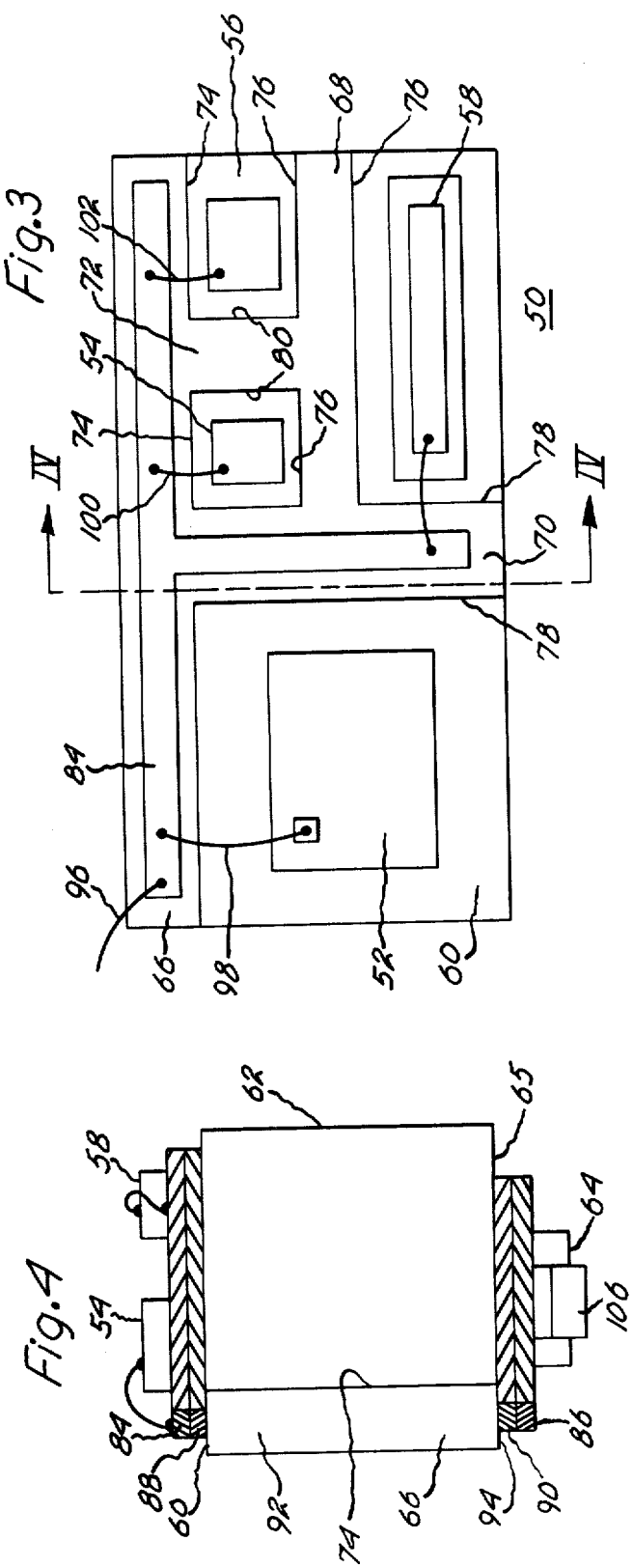

DEEP DIODE LEAD THROUGHS

This is a continuation of application Ser. No. 411,295, filed Oct. 30, 1973, now abandoned.

BACKGROUND OF THE INVENTION

1. Field of the Invention

This invention relates to semiconductor devices and in particular to a means for electrically interconnecting electrical elements associated with opposed major surfaces of the body.

2. Description of the Prior Art

Electrical leads between opposed major surfaces in integrated circuit devices are difficult to produce, involve extensive process steps as well as care of practicing the same, and tend to be unreliable. Electrical paths between the two surfaces require single or double diffusion steps. The resulting regions are excessively wide and the electrical conductivity of the region decreases with increasing depth into the semiconductor material from the diffusion surface. The decrease in electrical conductivity minimizes the circuit designs which may be employed in such a device. Additionally, the diffused regions require large volumes of material because of the lateral diffusion of the dopant material during the different drive processes. A satisfactory electrical lead through the body of material would enable a circuit designer to utilize both sides of the body for electrical circuits and enable one to achieve high density packaging of devices on individual chips.

An object of this invention is to provide a new and improved electrical cross-over means for semiconductor devices which overcome the deficiencies of the prior art.

Another object of this invention is to provide a new and improved electrical conductive path between two major opposed surfaces of the body of semiconductor material.

Another object of this invention is to provide a recrystallized region of semiconductor material having solid solubility of a dopant material therein which functions as an electrically conductive path between two opposed major surfaces of a semiconductor device.

Other objects will, in part, be obvious and will, in part, appear hereinafter.

BRIEF DESCRIPTION OF THE INVENTION

In accordance with the teachings of this invention, there is provided a semiconductor device comprising a body of semiconductor material. The body has two major opposed surfaces, a selected resistivity and a selected type conductivity. At least one region of second and opposite type conductivity and a selected resistivity is disposed in the body and extends between and terminates in the two major opposed surfaces. Each region of second type conductivity has opposed end surfaces, each of which is coextensive with one of the two major surfaces of the body. The material of each of the regions of second type conductivity is recrystallized material of the body having solid solubility of a material therein which imparts the selective type conductivity and resistivity thereto. Each region is a low electrical resistance path for conducting electrical current between the two opposed major surfaces. A P-N junction is formed by the contiguous surfaces of the opposite type conductivity materials of the respective region and body. The regions function as electrical lead throughs to electrically interconnect electrical devices associated with the respective opposed major surfaces. Regions having a planar configuration also function as electrical lead throughs as well as P-N junction isolation regions to electrically isolate mutually adjacent electrical devices as required.

DESCRIPTION OF THE DRAWINGS

FIG. 1 is an elevation view, partly in cross-section, of a portion of a semiconductor device embodying a lead through of this invention;

FIG. 2 is a top planar view of the device of FIG. 1;

FIG. 3 is a top planar view of another semiconductor device, embodying an alternate embodiment of a lead through of this invention, and FIG. 4 is an elevation view, partly in cross-section, of the device of FIG. 3 taking along the cutting plane IV—IV.

DESCRIPTION OF THE INVENTION

With reference to FIG. 1, where is shown a semiconductor device 10 comprising a body 12 of semiconductor material. The body 12 has a selected conductivity, a selected resistivity and opposed major surfaces 14 and 16. The semiconductor material comprising the body 12 may be silicon, germanium, silicon carbide, gallium arsenide, a compound of a Group II element and a Group VI element and a compound of a Group III and a Group V element.

One or more electrical devices 18 are associated with the surface 14 and one or more electrical devices 20 are associated with the surface 16. By the word associated, we mean that the electrical device may be an integrated circuit or an individual element that is either formed in the body 12 at the particular surface, has a mesa configuration or is affixed to the surface.

A region 22 of recrystallized semiconductor material having solid solubility of an impurity dopant therein extends completely through the body 12 from surface 14 to surface 16. The region 22 preferably has as high a concentration of dopant material therein to minimize its electrical resistance to maximize its electrical conductivity. The region 22 forms an electrical path between the two surfaces 14 and 16. Preferably, the region 22 is of opposite type conductivity than the conductivity of the body 12 in order to prevent detrimental changes to the electrical parameters of the body 12 and the devices 18 and 20. A P-N junction 24 is formed by the contiguous surfaces of the material of opposite type conductivity.

The region 22 is preferably formed by a thermal gradient zone melting process. For example, an aluminum droplet thermomigrated through a body 12 of N-type silicon produces a region 22 of recrystallized semiconductor material of the body 12 having P-type conductivity from the solid solubility of aluminum therein.

The regions 22 are formed by lapping and polishing the surface 14 of the body 12. A suitable mask such, for example, as silicon oxide on a body 12 of silicon, is disposed or grown on the surface 12. Photolithographical techniques and selective etching is employed to open windows in the mask to expose preselected areas of the surface 14. The windows measure less than 0.05 cm on a side and have a triangular configuration for a (111) surface and a square configuration for a (100) surface. Selective etching of the semiconductor material produces etched depressions 20 microns deep in the surface 14 aligned with the windows in the mask. A metal film approximately 20 micron in thickness is vapor deposited on the mask and the etched selective areas of the surface 14. Selective etching or methanical polishing is employed to remove the excess metal from the mask thereby leaving only the metal in the etched depressions.

The prepared body 12 is placed in a radiation thermal gradient apparatus at a pressure of $1 \times 10^{-5}$ torr. The metal is thermomigrated through the body 12 by maintaining a thermal gradient substantially along the vertical axis of the body 12. For example, when the metal is aluminum, a thermal gradient of from 50°C per centimeter to 200°C per centimeter is practiced wherein the furnace temperature is from 700°C to 1350°C. The process is practiced for a sufficient time to thermomigrate the metal droplet completely through the body 12 to the surface 16. Excess metal is removed from the surface 16 by mechanically polishing or selective etching.

For a more thorough discussion of the process of, and apparatus for, thermomigration of metal wires, one is referred to our copending patent applications Method of Making Deep Diode Devices, Ser. No. 411,150; Deep Diode Device Production and Method, Ser. No. 411,021; Deep Diode Devices and Method and Apparatus, Ser. No. 411,001; High Velocity Thermomigration Method of Making Deep Diodes, Ser. No. 411,015; Deep Diode Device Having Dislocation-Free P-N Junctions and Method, Ser. No. 411,009; and The Stabilized Droplet Method of Making Deep Diodes Having Uniform Electrical Properties, Ser. No. 411,008, filed concurrently with this application and assigned to the same assignee as this invention.

The resulting regions 24 are a low resistance and highly electrically conductive. The regions 24 comprise recrystallized material of the body 12 having solid solubility of metal therein to impart the resistivity and type conductivity to the region. The P-N junction 24 is well defined and exhibits substantially the ideal electrical characteristics to be expected for the materials involved.

An electrical contact 26 is affixed by a layer 28 of ohmic solder to the one end surface 30 of the region 22. An electrical lead 32 electrically interconnects the device and the region 22. An alternate means of electrically connecting electrical devices to the region 22 embodies an electrical contact 34 overlying in part a layer 36 of electrical insulating material, such for example, as silicon oxide, silicon nitride, aluminum oxide and the like. The layer 36 electrically isolates the contact 34 from accidental connections to unwanted devices, from short circuiting the circuits of the device 10 or from accidently shorting the P-N junction 24. A top planar view of this simple device arrangement is shown in FIG. 2.

Electrical devices 18 and 20 are electrically connected together. Electrical current flows into the device 20 via a lead 38 affixed to contact 34. The electrical current operates the circuitry of device 20 and flows also through the remainder of the contact 34 and via region 22, contact 30 and load 32 to device 18 and operates the circuitry or the device. Electrical current may then be carried via a lead 40 and electrical contact 42, affixed by a layer 44 of ohmic solder to region 22, through region 22 to the surface 16.

In essence, the configuration of the device 10 is that of a double sided printed circuit board. The region 22 acts as a plated through hole of a printed circuit board to electrically interconnect electrical circuits and devices mounted on the opposed major surfaces. The regions 22 act as electrical lead throughs. This novel concept enables one to have a more densely packed semiconductor chip since both sides of the body of silicon can be employed for device mounting. The electrical lead throughs or regions 22 permit a more efficient use of the semiconductor material. The lead throughs 22 may be formed before or after the devices 18 and 20 are fabricated or disposed on the respective surfaces 14 and 16 in accordance with manufacturing requirements.

It has been discovered that when the body 10 is of silicon, germanium, silicon carbide, gallium arsenide semiconductor material and the like, the droplet 22 has a preferred shape which also gives rise to the region 24 being of the same shape as the droplet 22. In a crystal axis direction of <111> of thermal migration, the droplet 22 migrates as a triangular platelet laying in a (111) plane. The platelet is bounded on its edges by (112) planes, A droplet 22 layer larger then 0.10 centimeter on an edge is unstable and breaks up into several droplets during migration. A droplet 22 less than 0.0175 centimeter does not migrate into the body 10 because of a surface barrier problem.

The ratio of the droplet migration rate over the improved thermal gradient is a function of the temperature at which thermomigration of the droplet 22 is practiced. At high temperatures, of the order of from 1100°C to 1400°C, the droplet migration velocity increases rapidly with increasing temperature. A velocity of 10 centimeters per day of $1.2 \times 10^{-4}$ centimeter per second is obtainable for aluminum droplets in silicon.

The droplet migration rate is also affected by the droplet volume. In an aluminum-silicon system, the droplet migration rate decreases by a factor of two when the droplet volume is decreased by a factor of 200.

A droplet 22 thermomigrates in the <100> crystal axis direction as a pyramidal bounded by four forward (111) planes and a rear (100) plane. Careful control of the thermal gradient and migration rate is a necessity. Otherwise, a twisted region 24 may result. It appears that there is a non-uniform dissolution of the four forward (111) facets in that they do not always dissolve at a uniform rate. Non-uniform dissolution of the four forward (111) facets may cause the regular pyramidal shape of the droplet to become distorted in a trapezoidal shape.

Referring now to FIGS. 3 and 4, thermomigration of metal wires is employed to produce regions for both electrical isolation of mutually adjacent regions and still function as an electrical lead through. An electrical device 50 embodies electrical devices 52, 54, 56 and 58 associated with a surface 60 of a body 62 of semiconductor material. The body 62 comprises any of the materials which comprise the body 12 of FIGS. 1 and 2. An electrical device 64 is associated with a surface 65 of the body 12. The electrical devices 52, 54, 56, 58 and 64 may be integrated circuits, memory circuits, discrete elements and the like. Planar regions 66, 68, 70 and 72 are formed in the body 62. The planar regions 66 through 72 having solid solubility of dopant metal of sufficient concentration to impart opposite type conductivity to the regions than that of the body 12. The contiguous surfaces of the material of the regions 66 through 72 and the material of the body 62 form respective P-N junctions 74, 76, 78 and 80. The planar regions 66 through 72 function as electrial lead throughs between surfaces 60 and 65 for interconnecting electrical devices associated with the respective surfaces 60 and 65. Additionally, the regions 66 through 72 form P-N junction isolation regions as a grid configuration to provide electrical isolation between adjacent electrical devices as required. The planar regions 66 through 72 are produced by the thermomigration of metal wires through the body 62 by a temperature gradient zone melting process.

Preferred planar orientations, wire directions on the planar surface and axis of migration for material having a desired cubic crystal structure and the like are tabulated in Table I.

Table I

| Wafer Plane | Migration Direction | Stable Wire Directions | Stable Wire Sizes |
|---|---|---|---|
| (100) | < 100 > | < 011 >* | 100 microns |
|  |  | > 0$\bar{1}$1 >* | 100 microns |
| (110) | < 110 > | < 1$\bar{1}$0 >* | 150 microns |
| (111) | < 111 > | a) < 01$\bar{1}$ > |  |
|  |  | < 10$\bar{1}$ > | 500 microns |
|  |  | < 1$\bar{1}$0 > |  |
|  |  | b) < 11$\bar{2}$ >* |  |
|  |  | < $\bar{2}$11 >* | 500 microns |
|  |  | < 1$\bar{2}$1 >* |  |
|  |  | c) Any other Direction in (111) plane | 500 microns |

*The stability of the migrating wire is sensitive to the alignment of the thermal gradient with the < 100 >, < 110 > and < 111 > axis, respectively.
†Group a is more stable than group b which is more stable than group c.

Suitable semiconductor materials of this crystal structure are silicon, silicon carbide, germanium and gallium arsenide. For a more complete description of the thermomigration of metal wires, one is directed to our copending patent application "Deep Diode Line Migration", Ser. No. 411,018, filed concurrently with this patent application and assigned to the same assignee of this invention.

For a more complete description of P-N junction isolation grid structures one is directed to a copending patent application entitled "Isolation Junctions For Semiconductor Devices", Ser. No. 411,012, by Manuel Torreno and assigned to the same assignee as this patent application.

The planar regions 66 through 72 also function as buss bars. Electrical leads may be affixed directly to the regions 66 through 72 but, however, electrical contact material 84 and 86 is affixed by respective layers 88 and 90 of ohmic solder to selected areas of the respective opposed surfaces 92 and 94 of the regions 66 and 70 respectively. A lead 96 electrically connects the contact 84 to an external power source. Leads 96, 98, 100, 102 and 104 connect respective devices 52, 54, 56 and 58 to the contact 84 of the buss bar. Electrical current is conducted by the regions 66 and 70 to the contact 86 from which an electrical contact 104, overlying a layer of electrically insulating material not shown, is required, electrically connects the device 64 to the contact 86. Again the electrically insulating material is one such, for example, as silicon oxide, silicon nitride, aluminum oxide and the like.

It has also been discovered that thermomigration of droplets and metal wires may be practiced in an inert gas atmosphere at a positive pressure, wherein the body of semiconductor material is a thin wafer of the order of 10 mil thickness. Lack of control of lateral thermal gradients does not appear to appreciably affect the process apparently because of the large ratio of planar surface area to side surface area.

We claim as our invention:

1. A semiconductor device comprising
    a body of single crystal semiconductor material having first and second major opposed surfaces comprising respectively, the top and bottom surfaces thereof, a first preferred level of resistivity, a preferred first type conductivity, a first preferred type conductivity, and a vertical axis aligned substantially parallel with a first preferred crystal axis of the material of the body;
    at least one of the opposed major surfaces having a preferred planar crystal orientation which is one selected from the group consisting of (111), (110) and (100);
    at least one region of second and opposite type conductivity having a second predetermined level of resistivity, and opposed end surfaces, disposed in the body and extending between and terminating in the two major opposed surfaces of the body, each of the end surfaces is coextensive with a respective one of the major surfaces, the material of the at least one region consisting of recrystallized semiconductor material of the body formed in situ in the body by the migration of a melt of metal-rich semiconductor material through the entire body, from one opposed major surface to the other, by thermal gradient zone melting at a predetermined elevated temperature along a thermal gradient aligned substantially parallel with the first preferred crystal axis and the vertical axis of the body and having the metal distributed substantially uniformly throughout the entire region, the level of concentration of the metal therein being determined by the solid solubility limit of that metal in that semiconductor material of the body at that predetermined elevated temperature of migration, the metal comprising a sufficient quantity of at least one dopant impurity material to impart the second type conductivity and second predetermined level of resistivity thereto, each of the at least one regions being a low electrical resistance path for conducting electrical currents between the major opposed surfaces of the body;
    each of the at least one region of second type conductivity having a vertical axis which is aligned substantially parallel with the first crystal axis;
    a P-N junction formed by the contiguous surfaces of the materials of each region and the body;
    at least one electrical device associated with one of the two major surfaces of the body;
    at least one electrical device associated with the other of the two major surfaces of the body, and
    means for electrically connecting the electrical devices associated with the respective two major opposed surfaces via the at least one region of second type conductivity.

2. The semiconductor device of claim 1 wherein
    at least one of the regions of second type conductivity is a planar region, and including
    each of the planar regions is oriented in a preferred wire direction which is aligned substantially parallel with a second preferred crystal axis of the material of the body,
    at least two electrical devices associated with one of the two major opposed surfaces of the body and electrically isolated from each other by the at least one planar region, and the electrical connecting means connects at least one of the two electrical devices associated with the one major surface with the at least one electrical device associated with the other major surface via the at least one planar region.

3. The semiconductor device of claim 2 wherein the preferred planar crystal orientation is (100), the first preferred crystal axis is < 100 >, and the second preferred crystal axis is one selected from the group consisting of < 011 > and < 0$\bar{1}$1 >.

4. The semiconductor device of claim 3 wherein the material of the body is one selected from the group consisting of silicon, silicon carbide, germanium and gallium arsenide.

5. The semiconductor device of claim 4 wherein the semiconductor material of the body is silicon of N-type conductivity, and
the dopant impurity material is aluminum.

6. The semiconductor device of claim 2 wherein the preferred planar crystal orientation is (110), the first preferred crystal axis is < 110 >, and the second preferred crystal axis is < 1$\bar{1}$0 >.

7. The semiconductor device of claim 6 wherein the semiconductor material of the body is one selected from the group consisting of silicon, silicon carbide, germanium and gallium arsenide.

8. The semiconductor device of claim 7 wherein the semiconductor material of the body is silicon of N-type conductivity, and
the dopant impurity material is aluminum.

9. The semiconductor device of claim 2 wherein the preferred planar crystal orientation is (111), and the first preferred crystal axis is < 111 >.

10. The semiconductor device of claim 9 wherein second preferred crystal axis is one selected from the group consisting of < 01$\bar{1}$ >, < 10$\bar{1}$ > and < 1$\bar{1}$0 >.

11. The semiconductor device of claim 10 wherein the semiconductor material of the body is one selected from the group consisting of silicon, silicon carbide, germanium and gallium arsenide.

12. The semiconductor device of claim 11 wherein the semiconductor material of the body is silicon of N-type conductivity, and
the dopant impurity material is aluminum.

13. The semiconductor device of claim 9 wherein the second preferred crystal axis is one selected from the group consisting of < 11$\bar{2}$ >, < $\bar{2}$11 > and < 1$\bar{2}$1 >.

14. The semiconductor device of claim 13 wherein the semiconductor material of the body is one selected from the group consisting of silicon, silicon carbide, germanium and gallium arsenide.

15. The semiconductor device of claim 14 wherein the material of the body is silicon of N-type conductivity, and
the dopant impurity material is aluminum.

16. The semiconductor device of claim 2 wherein a first electrical lead is affixed to one end surface of the at-least-one planar region for electrically connecting the semiconductor device into an external electrical circuit;

a plurality of second electrical leads, each second lead being affixed to a selected surface area of the same end surface of the at-least-one planar region as the first electrical lead and to only one of the electrical devices associated with the one major surface, and a third electrical lead affixed to the other end surface of the at-least-one planar region and the electrical device associated with the other of the two major surfaces of the body.

17. The semiconductor device of claim 2 wherein the semiconductor material of the body is silicon of N-type conductivity,
the second type conductivity is P-type and the dopant impurity material is aluminum.

18. The semiconductor device of claim 1 wherein the preferred planar crystal orientation is (110), and the first preferred crystal axis is < 110 >.

19. The semiconductor device of claim 18 and including
the first crystal axis is < 100 >.

20. The semiconductor device of claim 19 wherein the semiconductor material is silicon,
the first preferred conductivity is N-type,
the second preferred conductivity is P-type, and
the dopant impurity material is aluminum.

21. The semiconductor device of claim 18 wherein the material of the body is one selected from the group consisting of silicon, silicon carbide, germanium and gallium arsenide.

22. The semiconductor device of claim 21 wherein the semiconductor material of the body is silicon of N-type conductivity, and
the dopant impurity material is aluminum.

23. The semiconductor device of claim 1 wherein the preferred planar crystal orientation is (111), and the first preferred crystal axis is < 111 >.

24. The semiconductor device of claim 23 wherein the semiconductor material of the body is one selected from the group consisting of silicon, silicon carbide, germanium and gallium arsenide.

25. The semiconductor device of claim 24 wherein the semiconductor material of the body is silicon of N-type conductivity, and
the dopant impurity material is aluminum.

26. The semiconductor device of claim 1 wherein the preferred planar crystal orientation is (100), and the first preferred crystal axis is < 100 >.

27. The semiconductor device of claim 26 wherein the semiconductor material is one selected from the group consisting of silicon, silicon carbide, germanium and gallium arsenide.

28. The semiconductor device of claim 1 wherein the semiconductor material is one selected from the group consisting of silicon, silicon carbide, germanium and gallium arsenide.

29. The semiconductor device of claim 28 wherein the semiconductor material of the body is silicon of N-type conductivity, and
the second type conductivity is P-type, and the dopant impurity material is aluminum.

* * * * *